(12) United States Patent
Tanaka

(10) Patent No.: US 8,183,135 B2
(45) Date of Patent: May 22, 2012

(54) METHOD FOR MANUFACTURING THIN FILM TRANSISTOR HAVING HYDROGEN FEEDING LAYER FORMED BETWEEN A METAL GATE AND A GATE INSULATING FILM

(75) Inventor: Hiroaki Tanaka, Kanagawa (JP)

(73) Assignee: NEC Corporation, Minato-ku, Tokyo (JP)

( * ) Notice: Subject to any disclaimer, the term of this patent is extended or adjusted under 35 U.S.C. 154(b) by 0 days.

(21) Appl. No.: 12/379,991

(22) Filed: Mar. 5, 2009

(65) Prior Publication Data

US 2009/0209070 A1    Aug. 20, 2009

Related U.S. Application Data

(62) Division of application No. 10/793,845, filed on Mar. 8, 2004, now abandoned.

(30) Foreign Application Priority Data

Mar. 13, 2003 (JP) .................................. 2003-067858

(51) Int. Cl.
*H01L 21/336* (2006.01)

(52) U.S. Cl. ........ 438/487; 438/151; 438/164; 438/592; 438/910; 438/958

(58) Field of Classification Search .................. 438/149, 438/164, 197, 151, 487, 592, 910, 958
See application file for complete search history.

(56) References Cited

U.S. PATENT DOCUMENTS

| | | | |
|---|---|---|---|
| 4,954,855 A | 9/1990 | Mimura et al. | |
| 5,576,222 A | 11/1996 | Arai et al. | |
| 5,620,906 A * | 4/1997 | Yamaguchi et al. | .......... 438/162 |
| 5,771,110 A | 6/1998 | Hirano et al. | |
| 5,937,304 A | 8/1999 | Yoshinouchi et al. | |
| 6,210,997 B1 | 4/2001 | Adachi et al. | |
| 6,399,988 B1 | 6/2002 | Yamazaki | |
| 2001/0013607 A1 | 8/2001 | Miyasaka | |
| 2001/0055830 A1 | 12/2001 | Yoshimoto | |
| 2002/0020840 A1 | 2/2002 | Nakajima | |

FOREIGN PATENT DOCUMENTS

JP         62-204575         9/1987

(Continued)

OTHER PUBLICATIONS

S. Wolf et al., Silicon Processing for the VLSI Era. vol. 1, Process Technology. Lattice Press 1986., p. 194.*

*Primary Examiner* — Anh Mai
(74) *Attorney, Agent, or Firm* — McGinn Intellectual Property Law Group, PLLC

(57) ABSTRACT

A TFT (Thin Film Transistor) is provided in which a hydrogen feeding layer is able to be formed in a position where diffusing distance of hydrogen can be made short without causing an increase in photolithography processes. In the TFT, the hydrogen feeding layer to diffuse hydrogen into a dangling bond existing at an interface between a polycrystalline silicon thin film and a gate insulating film is formed in a position between the gate insulating film and a gate electrode. According to this configuration, diffusing distance of hydrogen at a period of time during hydrogenation can be made short and the hydrogenation process can be sufficiently performed without taking time in heat treatment.

7 Claims, 8 Drawing Sheets

FOREIGN PATENT DOCUMENTS

| | | |
|---|---|---|
| JP | 63-054773 | 3/1988 |
| JP | 04-058564 | 2/1992 |
| JP | 05-235353 | 9/1993 |
| JP | 06-037314 | 2/1994 |
| JP | 6-77484 | 3/1994 |
| JP | 6-209012 | 7/1994 |
| JP | 6-314697 | 11/1994 |
| JP | 07-106582 | 4/1995 |
| JP | 07-202210 | 8/1995 |
| JP | 07-249772 | 9/1995 |
| JP | 8-298327 | 11/1996 |
| JP | 9-252135 | 9/1997 |
| JP | 11-307777 | 11/1999 |
| JP | 2000-286426 | 10/2000 |
| JP | 2001-326357 | 11/2001 |
| JP | 2002-43330 | 2/2002 |

* cited by examiner

FIG. 6 *(hydrogenation using hydrogen fed only from hydrogen feeding layer 8)*
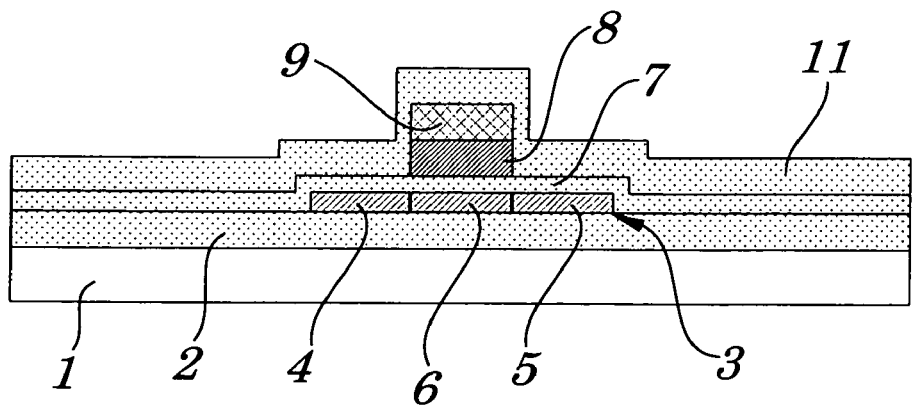
FIG. 7 *(formation of interlayer dielectric and hydrogenation are achieved simultaneously)*
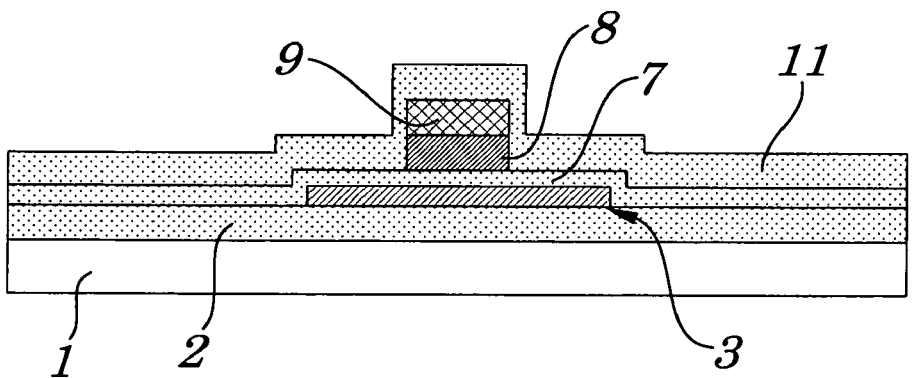
FIG. 8 *(formation of passivation film and hydrogenation are achieved simultaneously)*
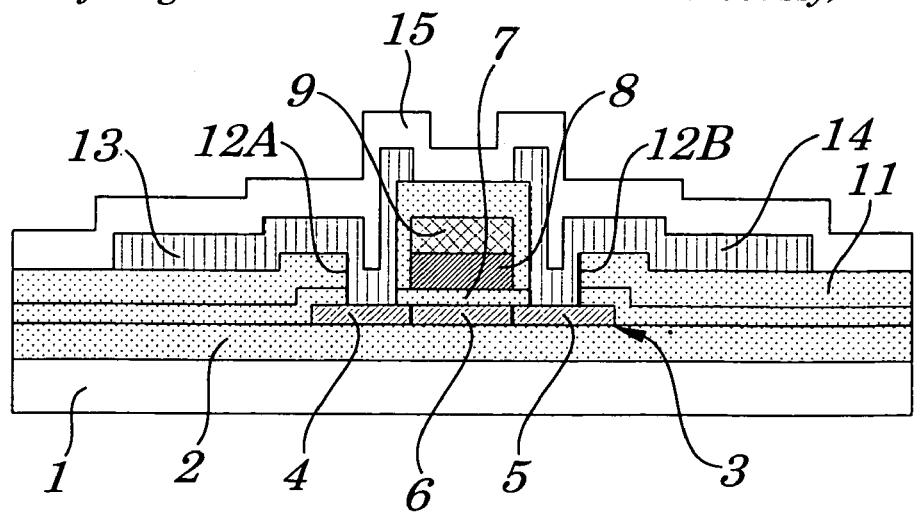

METHOD FOR MANUFACTURING THIN FILM TRANSISTOR HAVING HYDROGEN FEEDING LAYER FORMED BETWEEN A METAL GATE AND A GATE INSULATING FILM

The present application is a Divisional Application of U.S. patent application Ser. No. 10/793,845 filed on Mar. 8, 2004 now abandoned.

BACKGROUND OF THE INVENTION

Field of the Invention

The present invention relates to a thin film transistor (TFT) and a method for manufacturing the same and more particularly to the TFT using a polycrystalline semiconductor thin film formed on an insulating substrate as an active layer and to the method for manufacturing the TFT.

The present application claims priority of Japanese Patent Application No. 2003-067858 filed on Mar. 13, 2003, which is hereby incorporated by reference.

Description of the Related Art

Silicon is widely used as a semiconductor material for manufacturing a semiconductor device typified by an LSI (Large Scale Integrated) circuit. A TFT using a silicon thin film other than a single crystal silicon, such as an amorphous silicon thin film, a polycrystalline silicon thin film and a like, as an active layer, is used in a liquid crystal display (LCD), a contact-type image sensor, and a like. For example, in an active-matrix-type LCD, a TFT for a pixel being connected to a liquid crystal pixel placed in a matrix form is employed. Such the TFT has a MOS (Metal Oxide Semiconductor)-type structure in which an amorphous silicon thin film deposited at temperatures being lower than those employed when a single crystal silicon is deposited, or a polycrystalline silicon is deposited on a transparent insulating substrate such as a glass substrate (hereinafter may referred simply to as an "insulating substrate"), and a source region and a drain region are formed by implanting an impurity using an ion doping method.

An amorphous silicon thin film, as described above, has an advantage in that it can be deposited at relatively low temperatures, which enables the TFT to be manufactured by using, as the insulating substrate, a low-priced glass substrate having low heat resistance and in that it is excellent in mass productivity. Therefore, such the amorphous silicon thin film is widely used in LCDs, or a like. However, the amorphous silicon thin film has a disadvantage. That is, since the amorphous silicon thin film has no crystalline property, which causes its crystal grain to be small, it provides low carrier mobility. Therefore, if a driving TFT used in a driving circuit of an LCD is manufactured using such the amorphous silicon thin film at the same time when the TFT to be used for a pixel as above is manufactured, driving capability and operation speed of the driving circuit become low. Because of this, in an LCD using an amorphous silicon thin film as a TFT for a pixel, in many cases, a driving TFT in the driving circuit is employed in a form of an externally mounted component. In recent years, however, in an LCD, a need for being made thin and small-sized is increasing due to diversity of its applications and, as a result, a connecting pitch between the LCD and driving circuit on an insulating substrate becomes narrow and small. Therefore, if the driving circuit uses a driving TFT in a form of an externally mounted component, constraints are added when the connecting pitch has to be made narrow and small, which makes it difficult to achieve a large-screen and high-definition LCD.

On the other hand, in an TFT using a polycrystalline silicon thin film, instead of an amorphous silicon thin film, the polycrystalline silicon thin film, since it has a crystalline property to some extent, which causes its crystal grain to be larger than that of the amorphous silicon thin film, provides carrier mobility being higher than that of the amorphous silicon thin film. Therefore, in an LCD using a polycrystalline silicon thin film as a pixel TFT, by manufacturing a driving TFT using the polycrystalline silicon thin film at the same time when the pixel TFT is manufactured, driving capability and operation speed of a driving circuit can be improved. Moreover, the driving TFT and pixel TFT can be integrally formed on an insulating substrate, a connecting pitch between an LCD and driving circuit can be made narrow and small, thus enabling the LCD to be made thin and small sized. Therefore, a TFT using a polycrystalline silicon thin film tends to be preferably employed.

To form such the polycrystalline silicon thin film as described above, generally, after having deposited, in advance, an amorphous silicon thin film on an insulating substrate by a P-CVD (Plasma Chemical Vapor Deposition) method, by crystallizing the amorphous silicon thin film by performing heat treatment using a laser annealing method or a like, the amorphous silicon thin film is changed to be a polycrystalline silicon thin film. It is conventionally known that, after a source region and a drain region by using the polycrystalline silicon thin film obtained by the above method have been formed, when a TFT is manufactured by forming a gate electrode with a gate insulating film made up of a silicon dioxide ($SiO_2$) film being interposed between the gate electrode and the source region and drain region, an orbit in a nonbonded state called "dangling bond" in a polycrystalline silicon occurs at an interface between the polycrystalline silicon thin film serving as an active layer and the silicon dioxide ($SiO_2$) film serving as the gate insulating film. Since the dangling bond acts as a factor that increases a trap density in a grain boundary in the polycrystalline silicon, carrier mobility of the polycrystalline silicon becomes low and an increase in a threshold voltage or a like occurs, which produces a problem that a characteristic of a transistor is degraded.

Therefore, a method of hydrogenating the dangling bond is conventionally employed in which, by feeding hydrogen to the dangling bond and diffusing hydrogen into the dangling bond, an orbit being in a nonbonded state for a polycrystalline silicon is bonded to a hydrogen atom for being terminated. More concretely, in the hydrogenation of the dangling bond, by performing heat treatment, after having formed, in advance, a hydrogen feeding layer containing, hydrogen, within a part of a TFT, or by performing heat treatment in an atmosphere containing hydrogen, hydrogen is made to be diffused into the dangling bond.

A TFT in which such a hydrogen feeding layer for hydrogenation as described above is formed is disclosed in, for example, in Japanese Patent Application Laid-open No. Hei 6-77484 (first conventional example). The disclosed TFT 100, as shown in FIG. 9, includes an insulating substrate 101 made up of a glass substrate, a polycrystalline silicon thin film 102 formed on the insulating substrate 101, a source region 103 formed on one end of the polycrystalline silicon thin film 102, a drain region 104 formed on the other end of the polycrystalline silicon thin film 102, a channel region 105 formed between the source region 103 and drain region 104, a gate insulating film 106 made up of a silicon dioxide film formed on the polycrystalline silicon region 102, and a gate electrode 107 formed on the gate insulating film 106.

The disclosed TFT 100, as shown in FIG. 9, further includes an interlayer dielectric 108 made up of a silicon dioxide film formed on an entire surfaces being exposed containing a surface of the gate electrode 107, contact holes 109A and 109B formed in the interlayer dielectric 108, a source electrode 110 made up of an aluminum film formed so as to be connected to the source region 103, a drain electrode 111 made up of an aluminum film formed so as to be connected to the drain region 104, and a passivation film 112 made up of silicon nitride ($Si_3N_4$) containing much hydrogen on entire surfaces being exposed including surfaces of the source electrode 110 and the drain electrode 111. At a last stage of the TFT forming process, the hydrogenation is achieved by performing heat treatment, at 300° C. to 450° C., on the passivation film 112 serving as the hydrogen feeding layer to diffuse hydrogen contained in the hydrogen feeding layer in the dangling bond at an interface between the polycrystalline silicon thin film 102 and the gate insulating film 106.

However, in the conventional TFT 100 shown in FIG. 9, since the passivation film 112 is placed away by 1 μm from an interface between the polycrystalline silicon thin film 102 used to diffuse hydrogen and the gate insulating film 106, a diffusing distance of hydrogen is made long. Therefore, since much time is required in the heat treatment to sufficiently perform the hydrogenation process, there is a fear that a TFT is affected thermally. In the case of the TFT being large in size in particular, the influence is large.

To solve this problem, another TFT (second conventional example) in which a hydrogenation process is sufficiently performed by shortening a diffusing distance of hydrogen is disclosed also, as another example, in the above same Japanese Patent Application Laid-open No. Hei 6-77484. The disclosed TFT 120, as shown in FIG. 10, includes a lower layer polycrystalline thin film 121 formed on an insulating substrate 101, a hydrogen feeding layer 122 containing much hydrogen made up of a silicon nitride film and formed on the lower layer polycrystalline thin film 121, and an upper layer polycrystalline thin film 123, serving as an active layer, formed on the hydrogen feeding layer 122 in a manner to confine the hydrogen feeding layer 122. Moreover, same reference numbers are assigned to components having the same functions as those shown in FIG. 9 and descriptions of them are omitted accordingly.

According to the TFT 120 of the second conventional example as described above, the hydrogen feeding layer 122 is formed directly below the upper polycrystalline thin film 123 serving as the active layer and, therefore, the hydrogen feeding layer 122 is placed close to the interface between the upper polycrystalline silicon thin film 123 to be used for diffusing hydrogen and the gate insulating film 106, which enables the diffusing distance of hydrogen to be shortened. As a result, a sufficient hydrogenation process can be performed without much time being taken in the heat treatment.

Next, main processes of manufacturing the TFT 120 of the second conventional example are explained by referring to FIGS. 11A to 11E. First, as shown in FIG. 11A, after having deposited an amorphous silicon thin film on the insulating substrate 101 by using a P-CVD method, by applying a laser beam, for example, such as an exima laser to the amorphous silicon thin film to crystallize the amorphous silicon thin film so that it is changed to be a lower polycrystalline thin film 121. Then, as shown in FIG. 11B, the hydrogen feeding layer 122 is formed on the lower polycrystalline silicon thin film 121 made up of a silicon nitride film containing much hydrogen by using the P-CVD method. Next, as shown in FIG. 11C, patterning is performed by a photolithography method on the hydrogen feeding layer 122 so as to have a desired shape.

Then, as shown in FIG. 11D, the upper polycrystalline silicon thin film 123 is deposited on entire surfaces being exposed including a surface of the hydrogen feeding layer by the same method as employed when the lower polycrystalline silicon thin film 121 is deposited. Next, as shown in FIG. 1E, patterning is performed by the photolithography method on the lower polycrystalline silicon thin film 121 and the upper polycrystalline silicon film 123 at the same time so as to have a desired shape. Thus, the structure as shown in FIG. 10 is obtained in which the hydrogen feeding layer 122 is confined between the lower polycrystalline thin film 121 and upper polycrystalline thin film 123. By employing such the method of manufacturing the TFT as described above, it is made possible to manufacture the TFT as shown in FIG. 10 in which the hydrogen feeding layer 122 is placed close to the interface between the polycrystalline silicon thin film 123 used to diffuse hydrogen and the gate insulating film 106.

However, the conventional TFT and conventional method for manufacturing the same disclosed in Japanese Patent Application Laid-open No. Hei 6-77484 described above have a problem in that, in the disclosed technology, the photolithography process required to form the hydrogen feeding layer are increased, which causes a rise in manufacturing costs. That is, as described above, to manufacture the conventional TFT 20 as shown in FIG. 10, by using the manufacturing processes shown in FIGS. 11A to 11E, the structure has to be formed in which the hydrogen feeding layer 122 is confined between the lower polycrystalline silicon thin film 121 and the upper polycrystalline silicon thin film 123. However, as shown in FIG. 11C, to perform patterning on the hydrogen feeding layer 122 so as to have a desired shape, it is necessary to use additional photolithography processes. Moreover, in order to confine the hydrogen feeding layer 122, in addition to the upper polycrystalline silicon thin film 123 serving as the active layer, the lower polycrystalline silicon thin film 121 has to be deposited, which requires additional P-CVD processes. Such the increase in manufacturing processes causes reduction in yields, thus causing a rise in costs of manufacturing TFTs.

SUMMARY OF THE INVENTION

In view of the above, it is an object of the present invention to provide a TFT in which a hydrogen feeding layer is able to be formed in a position where diffusing distance of hydrogen can be shortened without causing an increase in photolithography processes and a method for manufacturing the same.

According to a first aspect of the present invention, there is provided a thin film transistor including:

a polycrystalline silicon thin film in which a source region and a drain region are formed; and a gate electrode formed on the polycrystalline silicon thin film with a gate insulating film interposed between the polycrystalline silicon thin film and the gate electrode;

wherein a hydrogen feeding layer to feed hydrogen into an interface between the polycrystalline silicon thin film and the gate insulating film is formed in a position between the gate insulating film and the gate electrode.

In the foregoing, a preferable mode is one wherein configurations of the hydrogen feeding layer are approximately same as those of the gate electrode.

Also, a preferable mode is one wherein the gate insulating film is made up of a silicon dioxide film.

According to a second aspect of the present invention, there is provided a method for manufacturing a thin film transistor having a source region and a drain region formed in a polycrystalline silicon thin film and a gate electrode formed on the polycrystalline silicon thin film with a gate insulating film interposed between the polycrystalline silicon thin film and the gate electrode, the method including:

a process of forming an island-structured polycrystalline silicon thin film having a desired shape on an insulating substrate;

a process of forming, after having formed the gate insulating film on the polycrystalline silicon thin film, a micro-crystalline silicon thin film and a metal thin film sequentially on the gate insulating film;

a process of etching, after having formed a corrosion-resistant mask layer having a desired shape on the metal thin film, the metal thin film using the corrosion-resistant mask layer to form the gate electrode having a desired shape;

a process of etching the micro-crystalline silicon thin film using the corrosion-resistant mask layer to form a hydrogen feeding layer having approximately same shape as the gate electrode;

a process of forming a first insulating film on entire surfaces being exposed containing a surface of the gate electrode;

a process of selectively implanting a desired impurity of a conductive type on the polycrystalline silicon thin film to form the source region and the drain region; and a process of performing heat treatment at 300° C. to 400° C. to feed hydrogen from the hydrogen feeding layer into an interface between the polycrystalline silicon thin film and the gate insulating film.

In the foregoing, a preferable mode is one wherein the process of feeding hydrogen is performed in an atmosphere containing hydrogen plasma.

Also, a preferable mode is one that wherein includes a process of forming, after the process of feeding hydrogen, contact holes in the first insulating film and the gate insulating film in a manner to expose the source region and the drain region and forming a source electrode to be connected to the source region through one of the contact holes and a drain electrode to be connected to the drain region through the other of the contact holes and a process of forming a second insulating film on entire surfaces being exposed containing surfaces of the source electrode and the drain electrode.

Also, a preferable mode is one wherein processes following the process of forming the micro-crystalline silicon thin film are performed at a temperature being lower than about 400° C.

Furthermore, a preferable mode is one wherein the gate insulating film includes a silicon dioxide film.

According to a third aspect of the present invention, there is provided a method for manufacturing a thin film transistor having a source region and a drain region formed on a polycrystalline silicon thin film and a gate electrode formed in the polycrystalline silicon thin film with a gate insulating film interposed between the polycrystalline silicon thin film and the gate electrode, the method including:

a process of forming an island-structured polycrystalline silicon thin film having a desired shape on an insulating substrate;

a process of forming, after having formed the gate insulating film on the polycrystalline silicon thin film, a micro-crystalline silicon thin film and a metal thin film sequentially on the gate insulating film;

a process of etching, after having formed a corrosion-resistant mask layer having a desired shape on the metal thin film, the metal thin film using the corrosion-resistant mask layer to form the gate electrode having a desired shape;

a process of etching the micro-crystalline silicon thin film using the corrosion-resistant mask layer to form a hydrogen feeding layer having approximately same shape as the gate electrode;

a process of forming a first insulating film on entire surfaces being exposed containing a surface of the gate electrode;

a process of selectively implanting a desired impurity of a conductive type on the polycrystalline silicon thin film to form the source region and the drain region, wherein the process of forming the first insulating film is performed at 300° C. to 400° C. to feed hydrogen from the hydrogen feeding layer into an interface between the polycrystalline silicon thin film and the gate insulating film.

In the foregoing, a preferable mode is one wherein a step in an atmosphere containing hydrogen plasma is contained in the process of forming the first insulating film to feed hydrogen.

According to a fourth aspect of the present invention, there is provided a method for manufacturing a thin film transistor having a source region and a drain region formed on a polycrystalline silicon thin film and a gate electrode formed in the polycrystalline silicon thin film with a gate insulating film interposed between the polycrystalline silicon thin film and the gate electrode, the method including:

a process of forming an island-structured polycrystalline silicon thin film having a desired shape on an insulating substrate;

a process of forming, after having formed the gate insulating film on the polycrystalline silicon thin film, a micro-crystalline silicon thin film and a metal thin film sequentially on the gate insulating film;

a process of etching, after having formed a corrosion-resistant mask layer having a desired shape on the metal thin film, the metal thin film using the corrosion-resistant mask layer to form the gate electrode having a desired shape;

a process of etching the micro-crystalline silicon thin film using the corrosion-resistant mask layer to form a hydrogen feeding layer having approximately same shape as the gate electrode;

a process of forming a first insulating film on entire surfaces being exposed containing a surface of the gate electrode;

a process of selectively implanting a desired impurity of a conductive type on the polycrystalline silicon thin film to form the source region and the drain region, wherein the process of forming the second insulating film is performed at 300° C. to 400° C. to feed hydrogen from the hydrogen feeding layer into an interface between the polycrystalline silicon thin film and the gate insulating film.

In the foregoing, a preferable mode is one wherein a step in an atmosphere containing hydrogen plasma is contained in the process of forming the first insulating film to feed hydrogen or in the process of forming the second insulating film.

According to a fifth aspect of the present invention, there is provided a method for manufacturing a thin film transistor having a source region and a drain region formed on a polycrystalline silicon thin film and a gate electrode formed in the polycrystalline silicon thin film with a gate insulating film interposed between the polycrystalline silicon thin film and the gate electrode, the method including:

a process of forming an island-structured polycrystalline silicon thin film having a desired shape on an insulating substrate;

a process of forming, after having formed the gate insulating film on the polycrystalline silicon thin film, a micro-crystalline silicon thin film and a metal thin film sequentially on the gate insulating film;

a process of etching, after having formed a corrosion-resistant mask layer having a desired shape on the metal thin film, the metal thin film using the corrosion-resistant mask layer to form the gate electrode having a desired shape;

a process of etching the micro-crystalline silicon thin film using the corrosion-resistant mask layer to form a hydrogen feeding layer having approximately same shape as the gate electrode;

a process of forming a first insulating film on entire surfaces being exposed containing a surface of the gate electrode;

a process of selectively implanting a desired impurity of a conductive type on the polycrystalline silicon thin film to form the source region and the drain region, wherein any one of processes following processes of forming the micro-crystalline silicon thin film is performed at 300° C. to 400° C. to feed hydrogen from the hydrogen feeding layer into an interface between the polycrystalline silicon thin film and the gate insulating film.

With the above configurations, the hydrogen feeding layer to diffuse hydrogen into an interface between the polycrystalline silicon thin film and the gate insulating film is formed in a position between the gate insulating film and the gate electrode and, therefore, diffusing distance of hydrogen at a period of time during hydrogenation can be made short.

With another configuration as above, after the gate insulating film has been formed on the polycrystalline silicon thin film as the active layer, the micro-crystalline silicon thin film and the metal thin film are sequentially deposited on the gate insulating film and then the tungsten silicide thin film and metal thin film are sequentially and selectively etched to form the gate electrode and the hydrogen feeding layer and, therefore, an independent process of photolithography to form the hydrogen feeding layer is not needed. As a result, the hydrogen feeding layer can be formed in a position where diffusing distance of hydrogen can be made short without causing an increase in the processes of photolithography.

BRIEF DESCRIPTION OF THE DRAWINGS

The above and other objects, advantages, and features of the present invention will be more apparent from the following description taken in conjunction with the accompanying drawings in which:

FIG. 6 is a process diagram showing a main process being employed in a method of manufacturing a TFT according to a second embodiment of the present invention;

FIG. 7 is a process diagram showing a main process being employed in the method of manufacturing a TFT according to a third embodiment of the present invention;

FIG. 8 is a process diagram showing a main process being employed in a method of manufacturing a TFT according to a fourth embodiment of the present invention;

DETAILED DESCRIPTION OF THE PREFERRED EMBODIMENTS

Best modes of carrying out the present invention will be described in further detail using various embodiments with reference to the accompanying drawings.

First Embodiment

Figure 1:
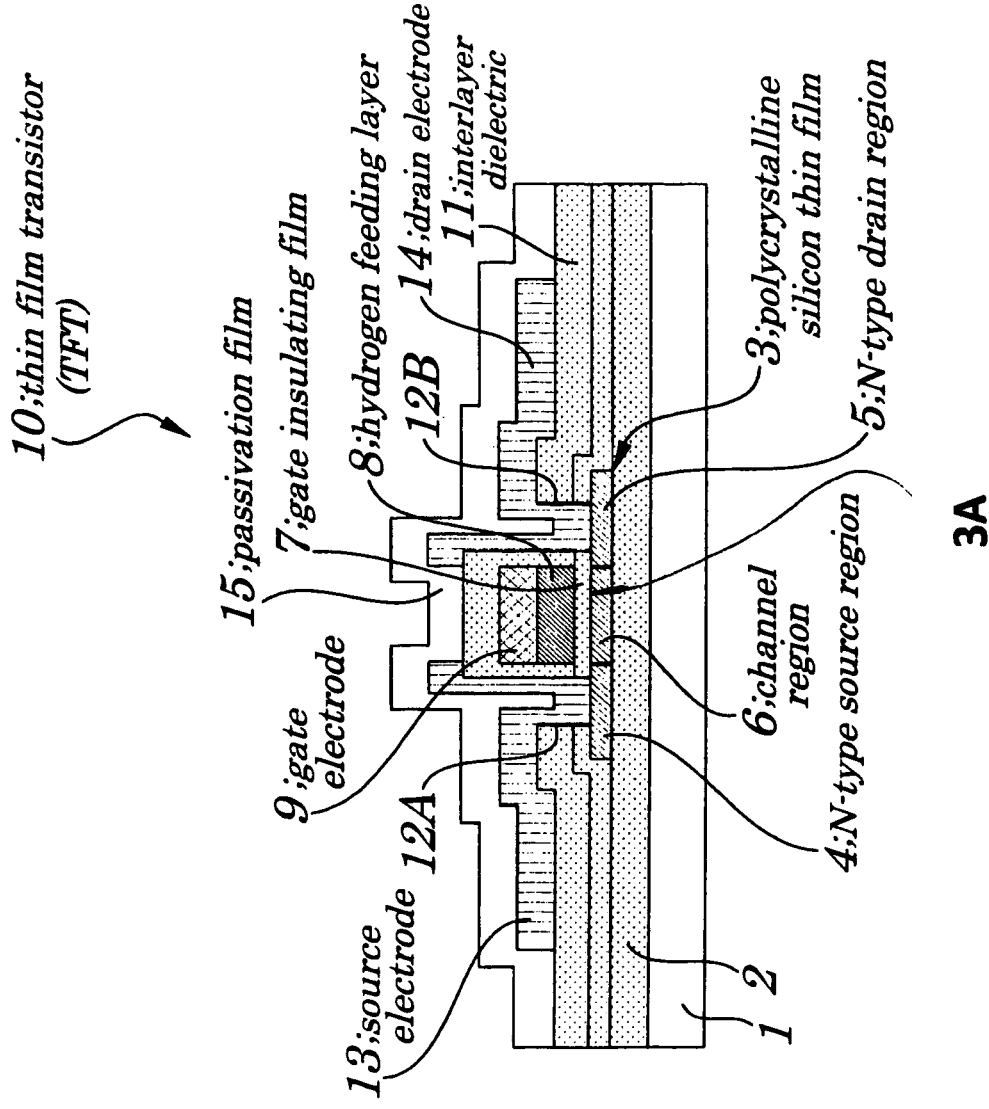
FIG. 1 is a cross-sectional view showing configurations of a TFT according to a first embodiment of the present invention.

FIG. 1 is a cross-sectional view showing a configuration of a TFT according to a first embodiment of the present invention. FIGS. 2A to 5C are process diagrams showing a method for manufacturing the TFT according to the first embodiment in order of processes. A TFT 10 of the first embodiment, as shown in FIG. 1, includes an insulating substrate 1, an underlying insulation film 2, an N-type source region 4, an N-type drain region 5, a channel region 6, a gate insulating film 7, a hydrogen feeding layer 8 and a gate electrode 9. The insulating substrate 1 is made up of, for example, an "OA2 substrate" (brand name of a substrate produced by Nippon Electric Glass Co., Ltd.). The underlying insulation film 2 is made up of a silicon dioxide film having its film thickness of 80 nm to 120 nm. On the underlying insulation film 2 is formed a polycrystalline silicon thin film 3 having its film thickness of 70 nm to 80 nm, in one end region of which an N-type source region 4 is formed, in another end region of which an N-type drain region 5 is formed, and in a center region of which a channel region 6 is formed between the N-type source region 4 and the N-type drain region 5. The gate insulating film 7 is made up of a silicon dioxide film having its film thickness of 35 nm to 45 nm formed on the polycrystalline silicon thin film 3. The hydrogen feeding layer 8 is formed on the gate insulating film 7 and made up of a micro-crystalline silicon thin film having its film thickness of 60 nm to 80 nm. And the gate electrode 9 is formed on the hydrogen feeding layer 8 and made up of a tungsten silicide thin film having its film thickness of 80 nm to 120 nm.

The TFT 10, as shown in FIG. 1, also includes an interlayer dielectric (first interlayer dielectric) 11 formed on entire surfaces of lower layers thereof including a surface of the gate electrode 9 and made up of a silicon nitride film having its film thickness of 280 nm to 320 nm, a source electrode 13 made up of an aluminum film having its film thickness of 370 nm to 430 nm and formed so that it is connected to the source region 4 through a contact hole 12A formed in the interlayer dielectric 11 and gate insulating film 7, a drain electrode 14 made up of an aluminum film having its film thickness of 370 nm to 430 nm and formed so that it is connected to the drain region 5 through a contact hole 12B formed in the interlayer dielectric 11 and gate insulating film 7, and a passivation film (second insulating film) 15 made up of a silicon nitride film having its film thickness of 250 nm to 280 nm and formed on entire surfaces of lower layers thereof including surfaces of the source electrode 13 and drain electrode 14.

As described above, with configurations of the TFT 10 according to the first embodiment, since the hydrogen feeding layer 8 for performing hydrogenation is formed in a position between the gate insulating film 7 and gate electrode 9, a distance between the hydrogen feeding layer 8 and an interface between the polycrystalline silicon thin film 3 to be used for diffusion of hydrogen and the gate insulating film 7 is made short. Therefore, since diffusing distance of hydrogen is shortened at a period of time during the hydrogenation, it becomes possible to perform a sufficient hydrogenation without taking much time in the heat treatment. As a result, since a trap density in a grain boundary in the polycrystalline silicon becomes small, a decrease in carrier mobility of the polycrystalline silicon can be prevented and since a threshold voltage drops, a transistor characteristic is improved.

Figure 2A:
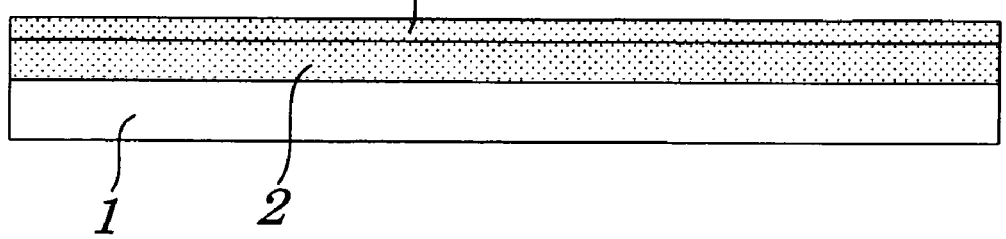
FIGS. 2A to 2C are process diagrams showing a method for manufacturing the TFT according to the first embodiment in order of processes.

Next, a method for manufacturing the TFT 10 of the embodiment is explained in order of processes by referring to FIG. 2A to FIG. 5C. First, as shown in FIG. 2A, the insulating substrate 1 made up of, for example, "OA2 substrate" (brand name of a substrate produced by Nippon Electric Glass Co., Ltd.) is prepared and an underlying insulation film 2 made up of a silicon dioxide film having its film thickness of 80 nm to 120 nm is deposited on the insulating substrate 1 by a P-CVD method using $SiH_4$ (mono-silane) and $N_2O$ (nitrogen oxide) as reactant gas. Then, an amorphous silicon thin film 16 having its film thickness of 70 nm to 80 nm is deposited on the underlying insulation film 2 by a low-pressure CVD method using $Si_2H_6$ (di-silane) as reactant gas.

Figure 2B:
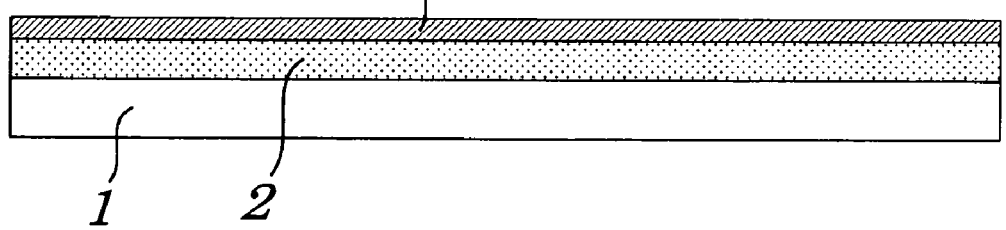

Next, a laser beam such as an exima laser is applied to the amorphous silicon thin film 16 to crystallize it and to change the amorphous silicon thin film 16 to be the polycrystalline silicon thin film 3, as shown in FIG. 2B.

Figure 2C:
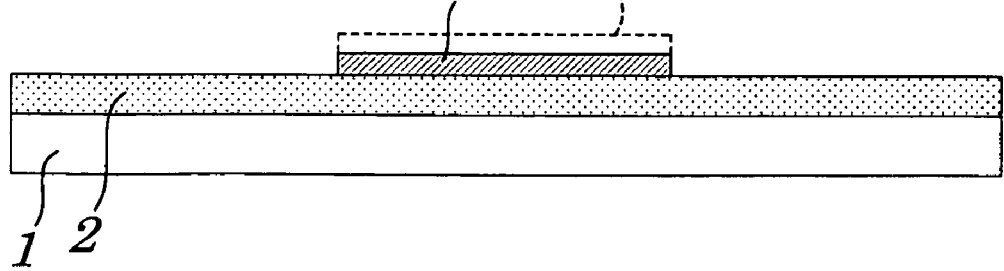
Figure 3A:
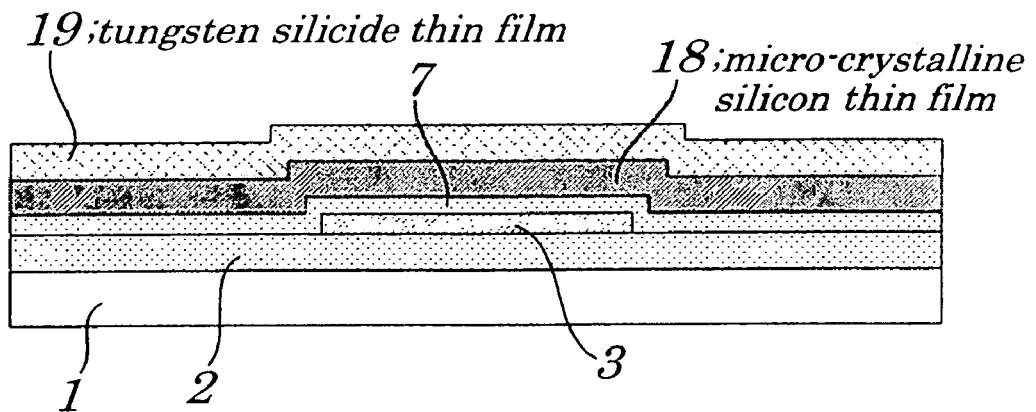
FIGS. 3A-3C are process diagrams showing the method for manufacturing the TFT according to the first embodiment in order of processes.

Then, as shown in FIG. 2C, after a resist mask layer (corrosion-resistant mask layer) 17 having a desired shape has been formed photolithographically on the polycrystalline silicon thin film 3, the polycrystalline silicon thin film 3 is etched selectively to be of an island-structure having a desired shape by a dry etching method using the resist mask layer 17 with $CF_4$ (carbon tetrafluoride) and $O_2$ (oxygen) as etching gas. Next, as shown in FIG. 3A, the gate insulating film 7 made up of a silicon dioxide having its film thickness of 35 nm to 45 nm is formed on entire surfaces being exposed including the surface of the island-structured polycrystalline silicon thin film 3 by a low-pressure CVD method using $SiH_4$ and $O_2$ as reactant gas. Then, by the P-CVD method using $SiH_4$, $PH_3$ (phosphine), and $H_2$ (hydrogen) as reactant gas, a micro-crystalline silicon thin film 18 serving as a hydrogen feeding layer and having its film thickness of 60 nm to 80 nm is deposited on the gate insulating film 7. The micro-crystalline silicon thin film 18 has a phase being intermediate between an amorphous silicon and a polycrystalline silicon and contains much hydrogen. Next, a tungsten silicide thin film (metal thin film) 19 having its film thickness of 80 nm to 120 nm is deposited by a sputtering method on the micro-crystalline silicon thin film 18.

Figure 3B:
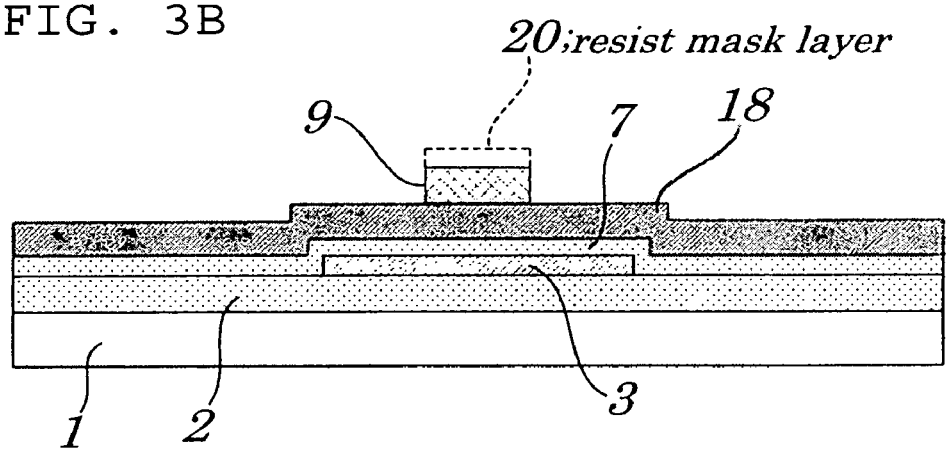

Then, as shown in FIG. 3B, after a resist mask layer (corrosion-resistant mask layer) 20 having a desired shape has been formed photolithographically on the tungsten silicide thin film 19, the tungsten silicide thin film 19 is etched selectively to form a gate electrode 9 by a dry etching method using the resist mask layer 20 and employing $CF_4$ (carbon tetrafluoride) and $O_2$ (oxygen) as etching gas. While the gate electrode 9 is being formed, by using etching gas having compositions described above, the tungsten silicide thin film 19 can be etched at a high etching rate.

Figure 3C:
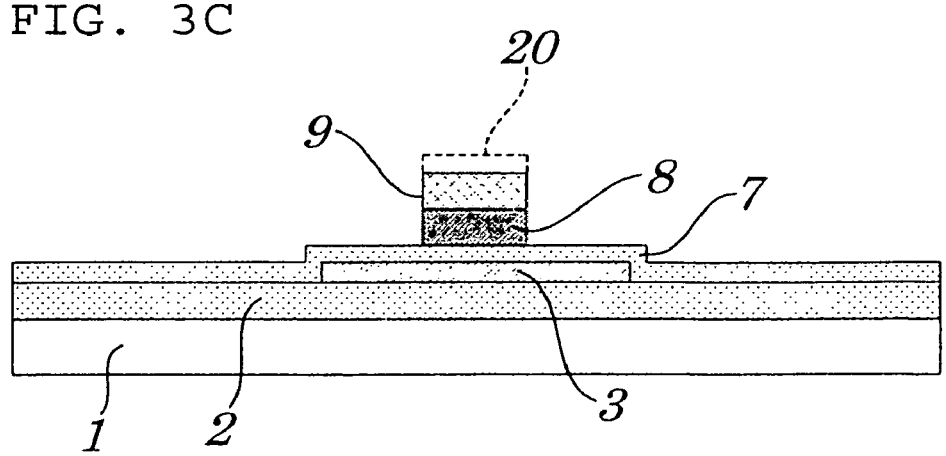

Next, as shown in FIG. 3C, the micro-crystalline silicon thin film 18 is selectively etched to form the hydrogen feeding layer 8 having the same shape as the gate electrode 9 by a dry etching process using the same resist mask 20 as used in the above process, without being removed, and employing $SF_6$ (sulfur hexafluoride), $Cl_2$ (chlorine) and $H_2$ as etching gas. At a period of time during the formation of the hydrogen feeding layer 8, the etching gas to be used for dry etching on the micro-crystalline silicon thin film 18 has to have a composition which can provide a high selective etching ratio between the micro-crystalline silicon thin film 18 and silicon dioxide film making up the gate insulating film 7 formed directly below the micro-crystalline silicon thin film 18. By using such the etching gas having the composition as described above, a high selective etching ratio being as high as about 20 or more can be obtained and, therefore, the micro-crystalline silicon thin film 18 only can be etched selectively. Moreover, the etching gas described above has an excellent capability of removing a residue of tungsten silicide. Furthermore, the dry etching method employed to form the gate electrode 9 and the hydrogen feeding layer 8 described above have an advantage in that, by switching each of the etching gases in the mid-course of the etching process, a same vacuum system can be used, serving to raise a throughput.

Thus, with the method for manufacturing the TFT according to the embodiment, since, by commonly using the resist mask layer 20 described above, the tungsten silicide thin film 19 is selectively etched to form the gate electrode 9 and then the micro-crystalline silicon thin film 18 is selectively etched to form the hydrogen feeding layer 8, the process of photolithography is not needed. That is, the hydrogen feeding layer 8 can be formed without causing an increase in the process of photolithography.

Figure 4A:
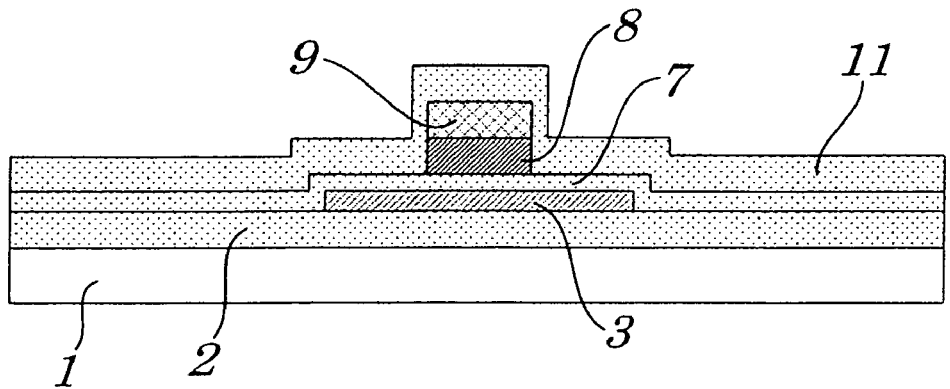
FIGS. 4A-4C are process diagrams showing the method for manufacturing the TFT according to the first embodiment in order of processes.

Next, as shown in FIG. 4A, an interlayer dielectric 11 made up of a silicon nitride film having its film thickness of 280 nm to 320 nm is deposited on entire surfaces being exposed including a surface of the gate electrode 9 by a P-CVD method using $SiH_4$, $NH_3$ (ammonia), and $H_2$ as reactant gas.

Figure 4B:
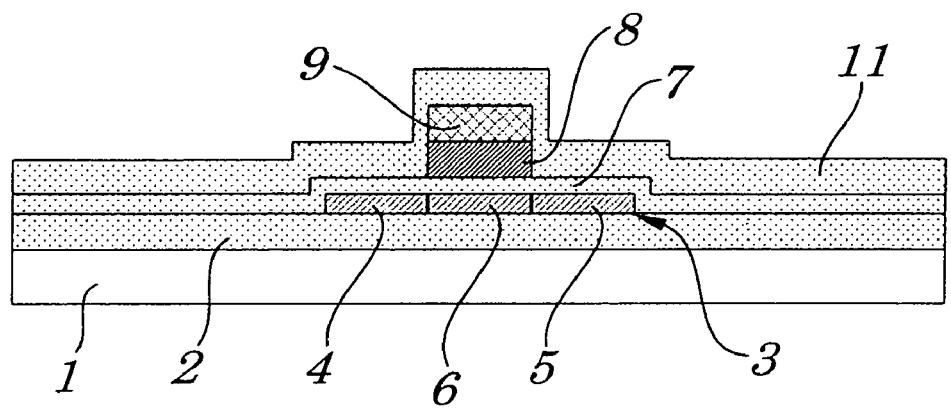

Then, as shown in FIG. 4B, P (phosphorus) is selectively implanted, by ion doping using $PH_3$ as an impurity source and by a self-alignment process using the gate electrode 9 as a mask, into both end regions of the polycrystalline silicon thin film 3 through the interlayer insulating film 11 and the gate insulating film 7. Then, by applying an exima laser to the both end regions of the polycrystalline silicon thin film 3 to perform an annealing process at about 400° C. to activate the impurity (P), the N-type source region 4 and the N-type drain region 5 are formed.

Figure 4C:
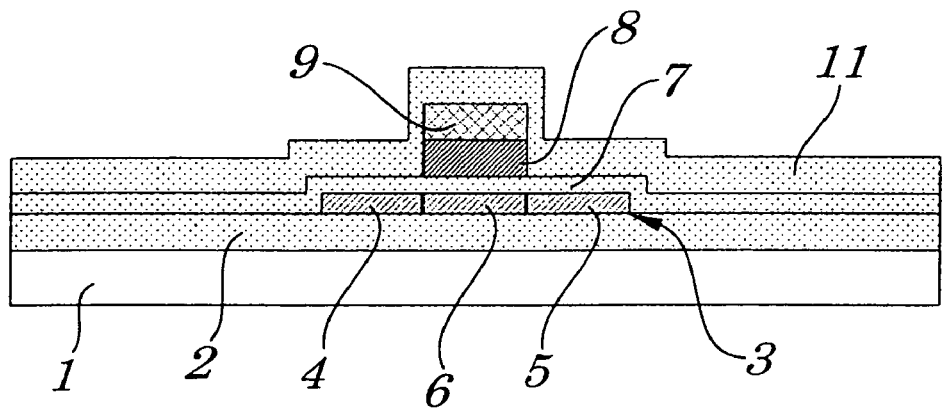

Next, as shown in FIG. 4C, by using a P-CVD equipment, heat treatment at about 400° C. is performed, for hydrogenation, on the insulating substrate 1 in an atmosphere containing a hydrogen plasma. That is, by the heat treatment described above, hydrogen is released from the hydrogen feeding layer 8 and is then diffused into the dangling bond existing at an interface between the polycrystalline silicon thin film 3 and silicon dioxide film making up the gate insulating film 7 to have an orbit being in an unbonded state be connected to an atom of hydrogen for termination. At a period of time during the hydrogenation, as described above, by performing the heat treatment in the atmosphere containing hydrogen plasma, hydrogen not only fed from the hydrogen feeding layer 8 but also provided in the atmosphere containing hydrogen plasma can be used for the diffusion and, therefore, an efficiency of hydrogenation can be improved. An efficiency of diffusing hydrogen can be enhanced even when the temperature of 400° C. for the heat treatment is lowered to 300° C. Also, in each process following the process of depositing the micro-crystalline thin film 18 serving as the hydrogen feeding layer 8 in FIG. 3D, in order to prevent hydrogen from being released unnecessarily, it is preferable that the heat treatment is performed at a temperature being lower than about 400° C.

Figure 5A:
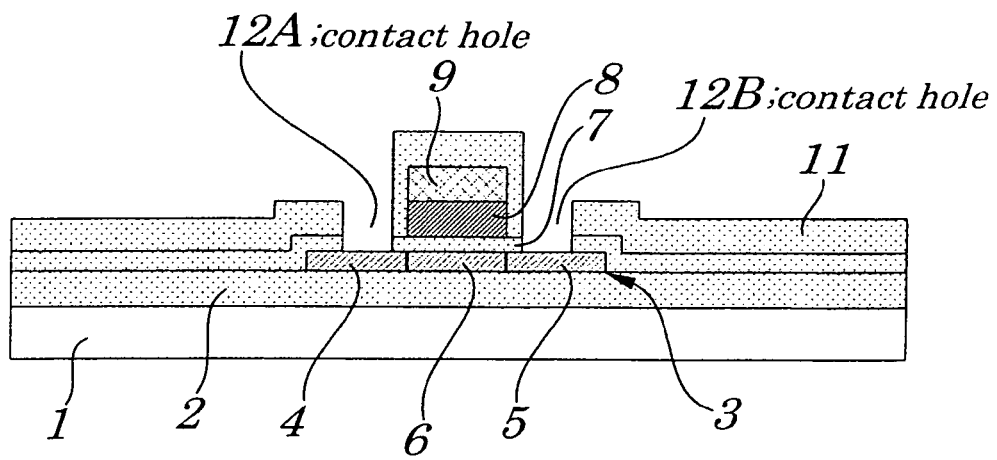
FIGS. 5A-5C are process diagrams showing the method for manufacturing the TFT according to the first embodiment in order of processes.

Then, as shown in FIG. 5A, after a resist mask layer (not shown) having a desired shape has been formed on the interlayer insulating film 11 by a photolithography process, the interlayer insulating film 11 and the gate insulating film 7 are selectively etched using the resist mask layer by a dry etching method using $CF_4$ and $H_2$ as etching gas to form contact holes 12A and 12B which expose the source region 4 and the drain region 5 respectively.

Figure 5B:
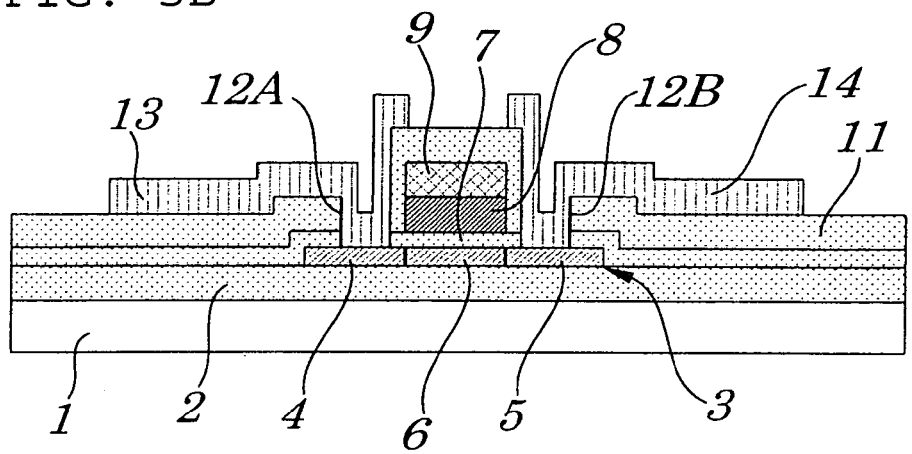

Next, as shown in FIG. 5B, after an aluminum film having its film thickness of 370 nm to 430 nm has been deposited on entire surfaces being exposed containing surfaces of the contact holes 12A and 12B by a sputtering method, by performing patterning on the aluminum film in a manner so as to have a desired shape, both the source electrode 13 to be connected to the source region 4 through the contact hole 12A and the drain electrode 14 to be connected to the drain region 5 through the contact hole 12B are simultaneously formed.

Figure 5C:
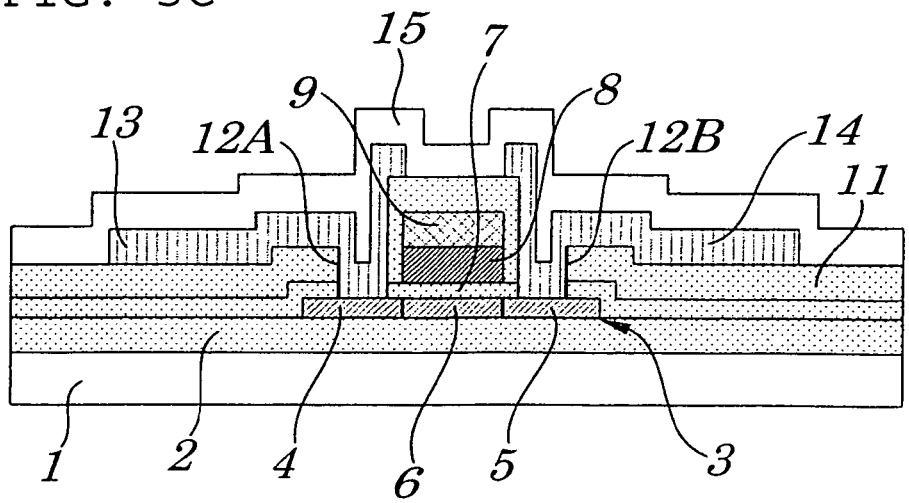
Figure 9:
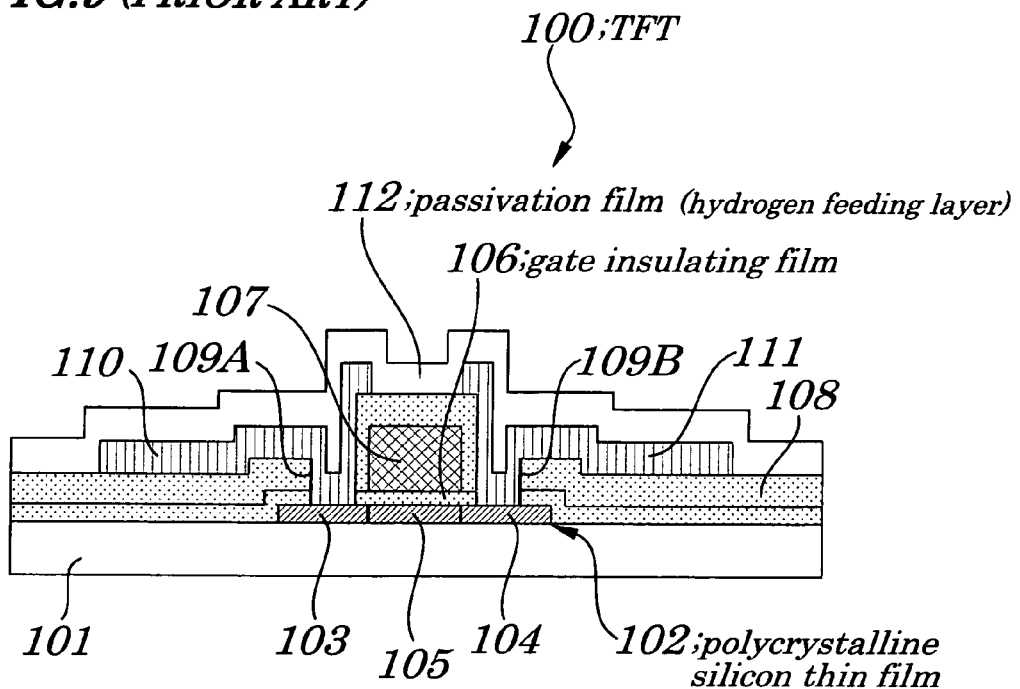
FIG. 9 is a cross-sectional view of a conventional TFT (first conventional example)
Figure 10:
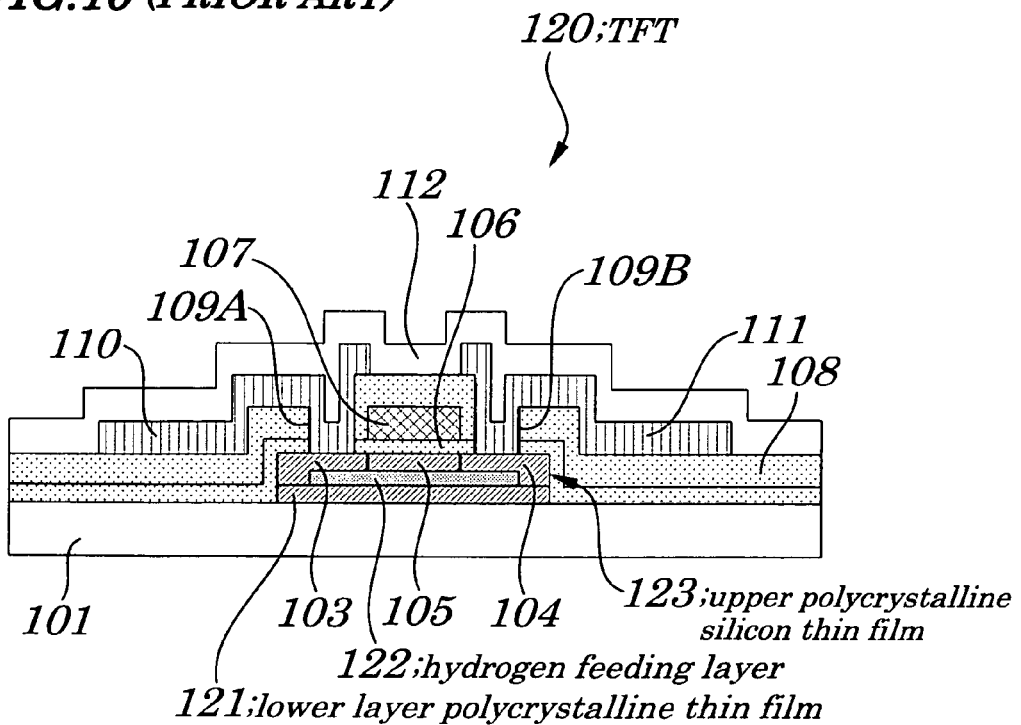
FIG. 10 is a cross-sectional view showing configuration of another conventional TFT (second conventional example)
Figure 11A:
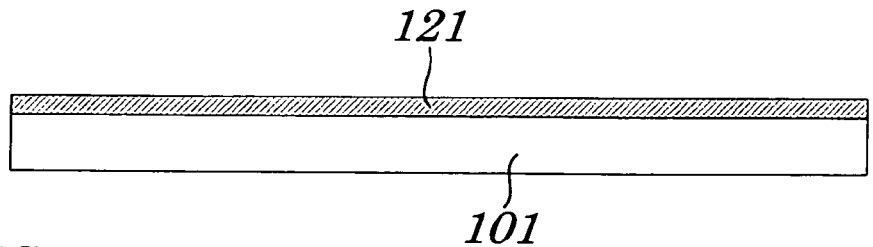
FIGS. 11A to 11E are cross-sectional view showing main processes being used in a method manufacturing the other conventional TFT (second conventional example).
Figure 11B:
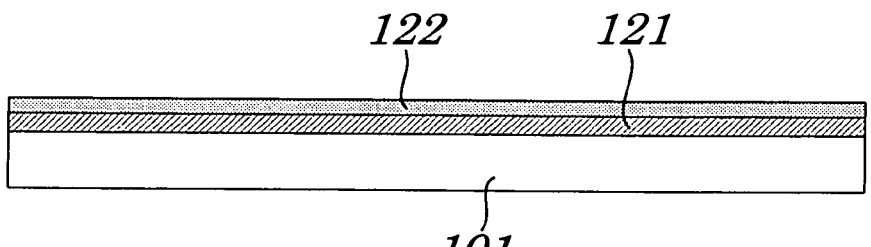
Figure 11C:
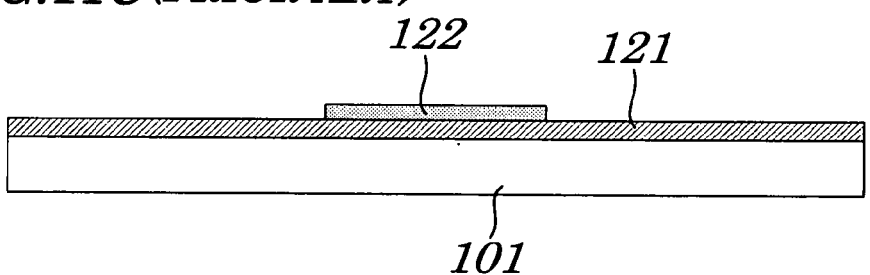
Figure 11D:
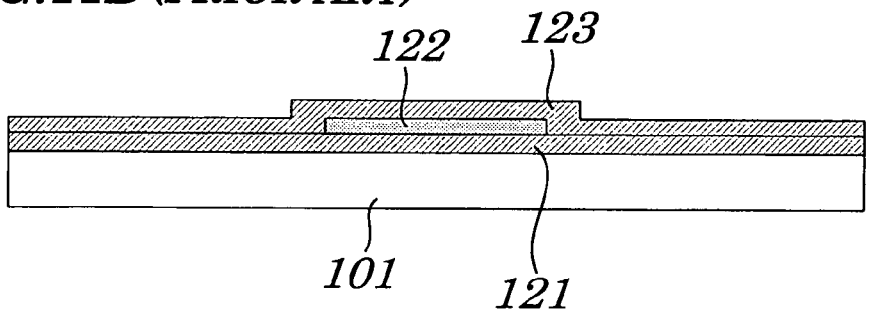
Figure 11E:
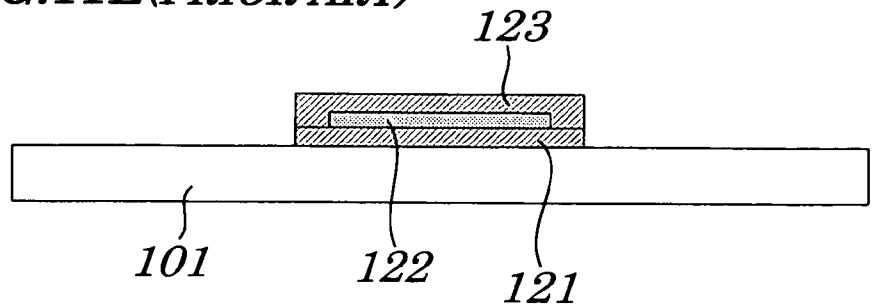

Finally, as shown in FIG. 5C, the TFT 10 of the embodiment is obtained by depositing the passivation film 15 made up of a silicon nitride film having its film thickness of 250 nm to 280 nm on entire surfaces being exposed containing surfaces of the source electrode 13 and drain electrode 14 by a P-CVD method using $SiH_4$, $NH_3$, and $H_2$ as reactant gas.

As described above, according to the method for manufacturing the TFT of the first embodiment of the present invention, as shown in the processes in FIGS. 3A-3C, after the gate insulating film 7 made up of the silicon dioxide film has been formed on the island-structured polycrystalline silicon thin film 3 serving as the active layer, the micro-crystalline silicon thin film 18 and the tungsten silicide thin film 19 are sequentially formed on the gate insulating film 7 and the tungsten silicide thin film 19 and micro-crystalline silicon thin film 18 are sequentially and selectively etched, by commonly using the resist mask layer 20 having a desired shape deposited on the tungsten silicide thin film 19, to form the gate electrode 9 and the hydrogen feeding layer 8 and, therefore, the process of photolithography to form the hydrogen feeding layer 8 is not needed. Moreover, in the first embodiment, a lower layer polycrystalline silicon thin film 121 and the P-CVD process to form the lower layer polycrystalline silicon thin film 121 shown in the conventional processes in FIGS. 11A to 11E are not required. Therefore, a decrease in yields caused by an increase in the processes can be avoided, which enables reduction in manufacturing costs.

Also, according to the method of manufacturing the TFT of the first embodiment, by performing the heat treatment on the insulating substrate 1 at 300° C. to 400° C. in the atmosphere containing hydrogen plasma, diffusion of hydrogen into the dangling bond can be carried out by using hydrogen not only fed from the hydrogen feeding layer 8 but also provided in the atmosphere containing hydrogen plasma and, therefore, an efficiency of hydrogenation can be improved.

Thus, according to the TFT 10 of the first embodiment, the hydrogen feeding layer 8 to diffuse hydrogen into an interface between the polycrystalline silicon thin film 3 and the gate insulating film 7 is formed in a position between the gate insulating film 7 and the gate electrode 9, a diffusing distance of hydrogen at a period of time during the hydrogenation can be shortened. Also, as described above, after the gate insulating film 7 made up of the silicon dioxide film has been formed on the island-structured polycrystalline silicon thin film 3 serving as the active layer, the micro-crystalline silicon thin film 18 and the tungsten silicide thin film 19 are sequentially formed on the gate insulating film 7 and the tungsten silicide thin film 19 and micro-crystalline silicon thin film 18 are sequentially and selectively etched, by commonly using the resist mask layer 20 having a desired shape deposited on the tungsten silicide thin film 19, to form the gate electrode 9 and the hydrogen feeding layer 8 and, therefore, the process of photolithography to form the hydrogen feeding layer 8 is not needed, which can reduce manufacturing costs. Therefore, according to the TFT of the embodiment, without increasing the processes of photolithography, a hydrogen feeding layer can be formed in a position which enables diffusing distance of hydrogen to be shortened.

Second Embodiment

FIG. 6 is a process diagram showing a main process being employed in the method of manufacturing a TFT according to a second embodiment of the present invention. The method for manufacturing the TFT of the second embodiment differs greatly from that in the first embodiment in that hydrogenation is achieved only by diffusion of hydrogen fed from a hydrogen feeding layer without using hydrogen provided in an atmosphere containing hydrogen plasma. Unlike the case of the first embodiment in which an N-type source region 4 and an N-type drain region 5 have been formed on a polycrystalline silicon thin film 3 in the process shown in FIG. 4B, and then the hydrogenation is carried out by performing heat treatment on an insulating substrate 1 in the atmosphere containing hydrogen plasma using the P-CVD method in the process shown in FIG. 4C, in the method for manufacturing the TFT of the second embodiment, the hydrogenation is carried out by performing heat treatment on the insulating substrate 1 at about 400° C. by using a heating system being ordinarily used as shown in FIG. 6. By performing the heat treatment by the heating system to release hydrogen from a hydrogen feeding layer 8 to have the hydrogen be diffused into a dangling bond existing at an interface between the polycrystalline silicon thin film 3 and the silicon dioxide film serving as a gate insulating film 7, an orbit being in an unbonded state of the polycrystalline silicon is connected to an atom of hydrogen for termination. In order to enhance a diffusing efficiency of hydrogen, it is preferable that the above heat treatment is performed within a temperature range of 300° C. to 400° C. Also, in each process following the process of depositing a micro-crystalline thin film 18 serving as the hydrogen feeding layer 8 in FIG. 3A, in order to prevent hydrogen from being released unnecessarily, it is preferable that the heat treatment is performed at a temperature being lower than about 400° C.

As described above, according to the method of manufacturing the TFT of the second embodiment, since the hydrogenation is achieved by diffusion of hydrogen fed only from the hydrogen feeding layer 8 without using hydrogen to be provided in an atmosphere containing hydrogen plasma, the hydrogenation can be carried out only by using the heat system being ordinarily used without using the P-CVD process, which enables the hydrogenation to be achieved in a simply way. Moreover, after the hydrogenation has been achieved, processes following the process shown in FIG. 5A may be repeated in almost the same way as employed in the first embodiment.

Thus, almost the same effect as obtained in the first embodiment can be achieved by the configurations of the second embodiment. Additionally, according to the second embodiment, the use of the P-CVD equipment is not necessary, so that the hydrogenation can be made simple.

Third Embodiment

FIG. 7 is a process diagram showing a main process being employed in the method of manufacturing a TFT according to a third embodiment of the present invention. The method for manufacturing the TFT of the third embodiment differs greatly from that of the first embodiment in that a process of formation of an interlayer dielectric (first insulating film) and a process of hydrogenation are performed at the same time. Unlike the case of the first embodiment in which an N-type source region 4 and an N-type drain region 5 have been formed on a polycrystalline silicon thin film 3 in the process shown in FIG. 4B, and then the hydrogenation is carried out by performing heat treatment in the process shown in FIG. 4C, in the method for manufacturing the TFT according to the third embodiment, the formation of an interlayer dielectric 11 as used in the first embodiment shown in FIG. 4A and the hydrogenation by performing heat treatment on an insulating substrate 1 at about 400° C. are achieved at the same time as shown in FIG. 7. By performing the heat treatment to form the interlayer dielectric 11 and, at the same time, to release hydrogen from a hydrogen feeding layer 8 to have the hydrogen be diffused into a dangling bond existing at an interface between the polycrystalline silicon thin film 3 and the silicon dioxide film serving as a gate insulating film 7, an orbit being in an unbonded state of the polycrystalline silicon is connected to an atom of hydrogen for termination.

In order to enhance a diffusing efficiency of hydrogen, it is preferable that the above heat treatment is performed within a temperature range of 400° C. to 300° C. Moreover, in each process following the process of depositing a micro-crystalline thin film 18 serving as the hydrogen feeding layer 8 in FIG. 3A, in order to prevent hydrogen from being released unnecessarily, it is necessary that the heat treatment is performed at a temperature being lower than about 400° C. Also, by carrying out the hydrogenation to be performed at the same time with the formation of the interlayer dielectric 11, as shown in the first embodiment, in an atmosphere containing hydrogen plasma, an efficiency of the hydrogenation can be further improved.

With the method of the third embodiment, since both the hydrogenation and the formation of the interlayer dielectric 11 are achieved at the same time, an independent hydrogenation process can be omitted, which can make the hydrogenation process simpler. Moreover, after the process of the hydrogenation, processes following the process employed in the first embodiment shown in FIG. 4B may be repeated.

Thus, almost the same effect as obtained in the first embodiment can be achieved by the configurations of the third embodiment.

Fourth Embodiment

FIG. 8 is a process diagram showing a main process being employed in a method of manufacturing a TFT according to a fourth embodiment of the present invention. The method for manufacturing a TFT of the fourth embodiment differs greatly from that employed in the first embodiment in that both a formation process of a passivation film (second insulating film) and a hydrogenation process are performed at the same time. In the method for manufacturing the TFT according to the fourth embodiment, unlike the case of the first embodiment in which an N-type source region 4 and an N-type drain region 5 have been formed on a polycrystalline silicon thin film 3 in the process shown in FIG. 4B, and then the hydrogenation is carried out by performing heat treatment in the process shown in FIG. 4C, the formation of the passivation film 15 as used in the first embodiment shown in FIG. 5C and the hydrogenation by performing heat treatment on the insulating substrate 1 at about 400° C. are achieved at the same time as shown in FIG. 8. By performing the heat treatment to form the passivation film 15 and, at the same time, to release hydrogen from the hydrogen feeding layer 8 to have the hydrogen be diffused into a dangling bond existing at an interface between the polycrystalline silicon thin film 3 and the silicon dioxide film serving as the gate insulating film 7, an orbit being in an unbonded state of the polycrystalline silicon is connected to an atom of hydrogen for termination.

In order to enhance a diffusing efficiency of hydrogen, it is preferable that the above heat treatment is performed within a temperature range of 400° C. to 300° C. Moreover, in each process following the process of depositing a micro-crystalline thin film 18 serving as the hydrogen feeding layer 8 in FIG. 3A, in order to prevent hydrogen from being released unnecessarily, it is necessary that the heat treatment is performed at a temperature being lower than about 400° C. Also, by carrying out the hydrogenation to be performed at the same time with the formation of the passivation film 15, as shown in the first embodiment, in an atmosphere containing hydrogen plasma, an efficiency of the hydrogenation can be further improved.

According to the method of the fourth embodiment, since the hydrogenation and the formation of the passivation film 15 are achieved at the same time, an independent hydrogenation process can be omitted, which can make the hydrogenation process simpler.

Thus, almost the same effect as obtained in the first embodiment can be achieved by the configurations of the fourth embodiment. Additionally, according to the fourth embodiment, since the independent process of the hydrogenation is omitted, the hydrogenation can be made simple.

It is apparent that the present invention is not limited to the above embodiments but may be changed and modified without departing from the scope and spirit of the invention. For example, each of the underlying insulation film, polycrystalline silicon thin film, gate insulating film, hydrogen feeding layer, gate electrode, interlayer dielectric, source electrode, drain electrode, various insulating films such as the passivation film, film thickness of the conductive film, deposition method, or a like described in the above embodiments is one example of components or conditions that can be applied to the present invention and, therefore, each of them may be changed depending on a purpose, application, or a like. In the above embodiments, the example is shown in which a silicon nitride film is used for the interlayer dielectric or the passivation film, however, instead of the silicon nitride film, a silicon dioxide film may be used. Insulating films other than described in the above embodiment such as a stacked film consisting of both a silicon nitride film and a silicon dioxide film may be employed. Moreover, an example in which aluminum is used for the source electrode and drain electrode is described in the above embodiment, however, instead of aluminum, other conductive materials such as an aluminum alloy containing aluminum as a main component, copper, a copper alloy containing copper as a main component, or a like may be employed. Furthermore, the conductive type of the source region and drain region to be formed on the polycrystalline silicon thin film may be not only of an N-type but also of a P-type.

What is claimed is:

1. A method for manufacturing a thin film transistor having a source region and a drain region formed in a polycrystalline silicon thin film and a gate electrode formed on said polycrystalline silicon thin film with a gate insulating film interposed between said polycrystalline silicon thin film and said gate electrode, said method comprising:
- a process of forming an island-structured polycrystalline silicon thin film on an insulating substrate;
- a process of forming, after having formed said gate insulating film on said polycrystalline silicon thin film, a micro-crystalline silicon thin film and a metal thin film sequentially on said gate insulating film;
- a process of etching, after having formed a corrosion-resistant mask layer on said metal thin film, said metal thin film using said corrosion-resistant mask layer to form said gate electrode having a desired shape;
- a process of etching said micro-crystalline silicon thin film using said corrosion-resistant mask layer to form a hydrogen feeding layer having an approximately same shape as said gate electrode;
- a process of forming a first insulating film on entire surfaces being exposed containing a surface of said gate electrode;
- a process of selectively implanting an impurity of a conductive type on said polycrystalline silicon thin film to form said source region and said drain region;
- a process of forming contact holes in said first insulating film and said gate insulating film in a manner to expose said source region and said drain region and forming a source electrode to be connected to said source region through one of said contact holes and a drain electrode to be connected to said drain region through another of said contact holes; and
- a process of forming a second insulating film on entire surfaces being exposed containing surfaces of said source electrode and said drain electrode, wherein each process after having formed said micro-crystalline silicon thin film is performed at room temperature being lower than about 400° C. to prevent hydrogen from being unnecessarily released from said micro-crystalline silicon thin film, wherein said process of forming said second insulating film is performed using $SiH_4$, $NH_3$, and $H_2$ as reactant gas at 300° C. to 400° C. simultaneously to feed hydrogen from said hydrogen feeding layer into an interface between said polycrystalline silicon thin film and said gate insulating film, and wherein said process of forming said second insulating film is performed in an atmosphere containing hydrogen plasma to improve an efficiency of hydrogenation of said interface.

2. The method for manufacturing a thin film transistor according to claim 1, wherein said gate insulating film comprises a silicon dioxide film.

3. The method for manufacturing a thin film transistor according to claim 1, wherein said process of forming the micro-crystalline silicon thin film comprises depositing the micro-crystalline silicon thin film by a P-CVD method using $SiH_4$, $PH_3$, and $H_2$ as a reactant gas.

4. The method for manufacturing a thin film transistor according to claim 1, wherein the metal thin film and the micro-crystalline silicon thin film are separately etched using said corrosion-resistant mask layer without removing said corrosion-resistant mask layer.

5. The method for manufacturing a thin film transistor according to claim 1, wherein the metal thin film is etched using $CF_4$ and $O_2$ as an etching gas, and wherein the micro-crystalline silicon thin film is etched using $SF_6$, $Cl_2$, and $H_2$ as an etching gas.

6. The method for manufacturing a thin film transistor according to claim 1, wherein a width of said hydrogen feeding layer is equal to a width of said gate electrode.

7. The method for manufacturing a thin film transistor according to claim 1, wherein said hydrogen feeding layer comprises a thickness in a range of 60 nm to 80 nm.

* * * * *